United States Patent
Chang et al.

(10) Patent No.: US 11,217,934 B2
(45) Date of Patent: Jan. 4, 2022

(54) SOCKET COVER

(71) Applicant: Intel Corporation, Santa Clara, CA (US)

(72) Inventors: Ming-Chen Chang, Portland, OR (US); Mustafa H. Haswarey, Tigard, OR (US); Praneetha Kolla, Portland, OR (US); Whitten Schulz, Hillsboro, OR (US)

(73) Assignee: Intel Corporation, Santa Clara, CA (US)

( * ) Notice: Subject to any disclaimer, the term of this patent is extended or adjusted under 35 U.S.C. 154(b) by 661 days.

(21) Appl. No.: 16/016,378

(22) Filed: Jun. 22, 2018

(65) Prior Publication Data

US 2019/0393643 A1    Dec. 26, 2019

(51) Int. Cl.
 *H01R 13/44* (2006.01)
 *H01R 13/52* (2006.01)
 *H01R 43/00* (2006.01)
 *H01R 12/70* (2011.01)

(52) U.S. Cl.
 CPC ..... *H01R 13/5213* (2013.01); *H01R 12/7076* (2013.01); *H01R 43/005* (2013.01)

(58) Field of Classification Search
 CPC .... H01R 13/447; H01R 39/00; H01R 13/629; H01R 13/62933; G06K 13/08
 USPC ...... 439/135, 341.1, 157, 159, 16, 372, 152, 439/373, 144
 See application file for complete search history.

(56) References Cited

U.S. PATENT DOCUMENTS

| | | | | |
|---|---|---|---|---|
| 5,716,235 | A * | 2/1998 | Endo | H01R 13/436 439/596 |
| 6,267,608 | B1 * | 7/2001 | Yagi | H01R 13/447 439/142 |
| 6,267,614 | B1 * | 7/2001 | Good | H01R 13/639 439/160 |
| 7,679,933 | B2 * | 3/2010 | Makabe | G06F 1/185 361/801 |
| 2003/0139094 | A1 * | 7/2003 | Venditti | H01R 13/506 439/596 |
| 2007/0287320 | A1 * | 12/2007 | Shiota | H01R 12/79 439/352 |

* cited by examiner

*Primary Examiner* — Phuong Chi Thi Nguyen
(74) *Attorney, Agent, or Firm* — Patent Capital Group

(57) ABSTRACT

Embodiments may relate to a cover for a socket of a computing device. The cover may include a cover piece and a locking mechanism attached to the cover piece by a hinge. The locking mechanism, when in a locked position, may removably secure the cover to a bolster such that the cover piece overlays the socket. Other embodiments may be described and/or claimed.

19 Claims, 7 Drawing Sheets

SOCKET COVER

FIELD

Embodiments of the present disclosure generally relate to covers for computing device sockets.

BACKGROUND

Generally, it may be desirable to protect sockets in computing devices when they are not in use. The sockets may be, for example, sockets for computing components such as memory, central processing units (CPUs), other processors or components, etc. Legacy socket covers may have had various drawbacks such as requiring an excess amount of force to secure or remove, unergonomic design, etc.

DETAILED DESCRIPTION

Figure 1:
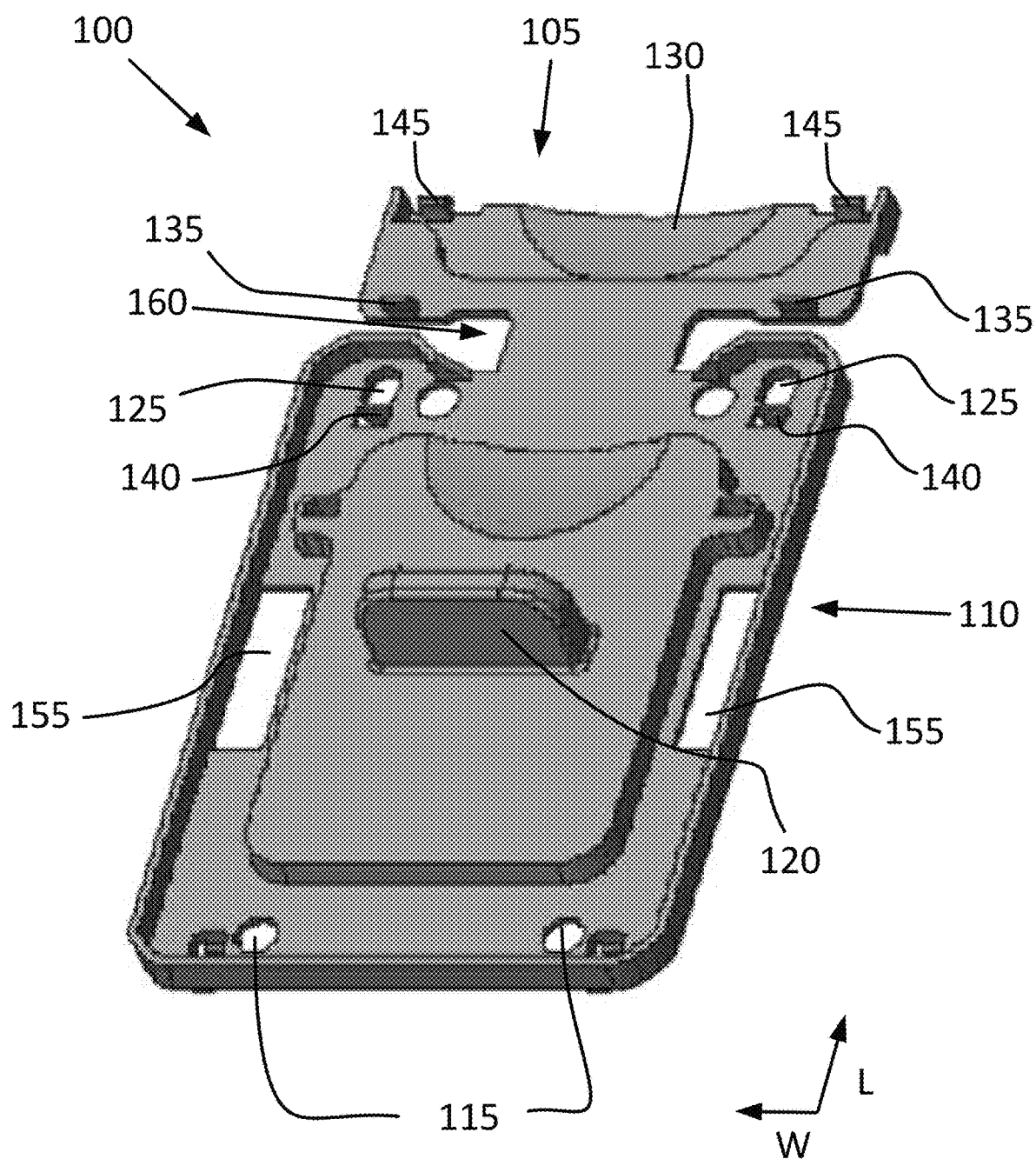
FIG. 1 depicts an example dust cover, in accordance with various embodiments.

In the following detailed description, reference is made to the accompanying drawings which form a part hereof, wherein like numerals designate like parts throughout, and in which is shown by way of illustration embodiments in which the subject matter of the present disclosure may be practiced. It is to be understood that other embodiments may be utilized and structural or logical changes may be made without departing from the scope of the present disclosure. Therefore, the following detailed description is not to be taken in a limiting sense.

For the purposes of the present disclosure, the phrase "A or B" means (A), (B), or (A and B). For the purposes of the present disclosure, the phrase "A, B, or C" means (A), (B), (C), (A and B), (A and C), (B and C), or (A, B and C).

The description may use perspective-based descriptions such as top/bottom, in/out, over/under, and the like. Such descriptions are merely used to facilitate the discussion and are not intended to restrict the application of embodiments described herein to any particular orientation.

The description may use the phrases "in an embodiment," or "in embodiments," which may each refer to one or more of the same or different embodiments. Furthermore, the terms "comprising," "including," "having," and the like, as used with respect to embodiments of the present disclosure, are synonymous.

The term "coupled with," along with its derivatives, may be used herein. "Coupled" may mean one or more of the following. "Coupled" may mean that two or more elements are in direct physical or electrical contact. However, "coupled" may also mean that two or more elements indirectly contact each other, but yet still cooperate or interact with each other, and may mean that one or more other elements are coupled or connected between the elements that are said to be coupled with each other. The term "directly coupled" may mean that two or elements are in direct contact.

In various embodiments, the phrase "a first feature formed, deposited, or otherwise disposed on a second feature," may mean that the first feature is formed, deposited, or disposed over the feature layer, and at least a part of the first feature may be in direct contact (e.g., direct physical or electrical contact) or indirect contact (e.g., having one or more other features between the first feature and the second feature) with at least a part of the second feature.

Various operations may be described as multiple discrete operations in turn, in a manner that is most helpful in understanding the claimed subject matter. However, the order of description should not be construed as to imply that these operations are necessarily order dependent.

Embodiments herein may be described with respect to various Figures. Unless explicitly stated, the dimensions of the Figures are intended to be simplified illustrative examples, rather than depictions of relative dimensions. For example, various lengths/widths/heights of elements in the Figures may not be drawn to scale unless indicated otherwise.

Generally, it may be desirable for sockets such as CPU sockets, memory sockets, or sockets related to other computing components to be protected at times when they are not being used. One form of protecting the sockets may include using a dust cover. In some embodiments, it may be desirable for the dust cover to meet a variety of conditions. One condition may include an assembly force requirement of less than or equal to 4.3 foot-pounds of force. Another condition may include a dis-assembly force requirement of less than or equal to 3.7 foot-pounds of force. Another condition may include an ability to withstand at least 50 G's of dynamic shock. As used herein, a "G" may refer to approximately 9.8 Newtons of force per kilogram of mass of the object being measured. Similarly, another condition may include an ability to withstand at least 100 G's of static shock. Another condition may include an ability to withstand a vibration test. Specifically, it may be desirable for the dust cover to withstand vibration between approximately five hertz (Hz) and approximately 500 Hz. Another condition may relate to a cost of less than or equal to approximately $0.65 in high volume manufacturing (HVM). Another condition may relate to the dust cover having a grip feature that may be used without damaging the dust cover or the socket.

Legacy dust covers may have suffered from a variety of difficulties. For example, some legacy dust covers may have required a lower mass in order to meet a combination of shock requirements and ergonomic requirements. However, this relatively low mass may have made it difficult to include features that would make the dust cover more ergonomically.

Additionally, it may be difficult to meet one or more of the above conditions as sockets become larger or more complex. Specifically, although it may be possible to make a dust cover that has a relatively low push force and pull force requirement, the dust cover may not be able to pass the above-referenced shock or vibration tests. As used herein, "push force" may refer to the force required to secure the dust cover to the socket. "Pull force" may refer to the force required to remove the dust cover from the socket. Conversely, to pass the above-referenced shock or vibration tests, it may be necessary to stiffen the dust cover or, more specifically, the feature used to latch the dust cover to the socket. This stiffening may increase the push and pull force of the dust cover.

Finally, users of the dust cover may desire a prominent usable gripping feature on the dust cover. This gripping feature may be so that a user of the dust cover has a way to easily move or remove the dust cover from a board without damaging the board. Legacy dust covers may not have included this feature.

Embodiments herein may relate to a dust cover that include a locking feature that mitigates the various requirements above. Specifically, the dust cover may be desirable from an ergonomics point of view when installing or removing the dust cover from the socket. The dust cover may also have a higher structural strength than legacy dust covers, have a suitable mass to provide the structural strength, include a gripping feature, or be suitable for the above-referenced shock or vibration requirements. Specifically, embodiments herein may include one or more of the following features:

A push force of less than or equal to one foot-pound of force.

A pull force of less than or equal to one foot-pound of force.

The decreased pull force may provide the advantage of reducing the risk of an operator of the dust cover accidentally dropping the dust cover on to the socket pin field. The reduced risk may be because the decreased pull force may lessen the sudden transition between when an operator of the dust cover is pulling on the dust cover and when the dust cover latch releases/the dust cover breaks free.

A user-friendly gripping feature that increases ease-of-use of the dust cover, reducing the possibility of damaging the socket while using the dust cover.

Increased mass that allows the dust cover to provide structural strength as well as the above-mentioned gripping feature.

Alignment features that may increase ease-of-use of the dust cover.

Relatively low cost.

Increased tolerance for mis-alignments of the dust cover.

These and other advantages may be realized by embodiments of the dust cover herein. Specifically, embodiments may relate to a dust cover that is a single injection molded piece. The single element may be referred to as, for example, a "unitary piece of material." The injection molded element may decrease cost by, for example, reducing the cost/need for tooling and eliminating the need for assembly after manufacturing the dust cover. The single injection molded piece may also mitigate the conflicting requirements for a relatively low push or pull force while still needing a relatively high structural strength and relative low mass. Generally, the dust cover may include a robust locking mechanism that may help lock the dust cover in place. The locking mechanism may, for example, allow for a locking mechanism to be flipped over to a cover element to lock the dust cover in place on a socket.

Figure 2:
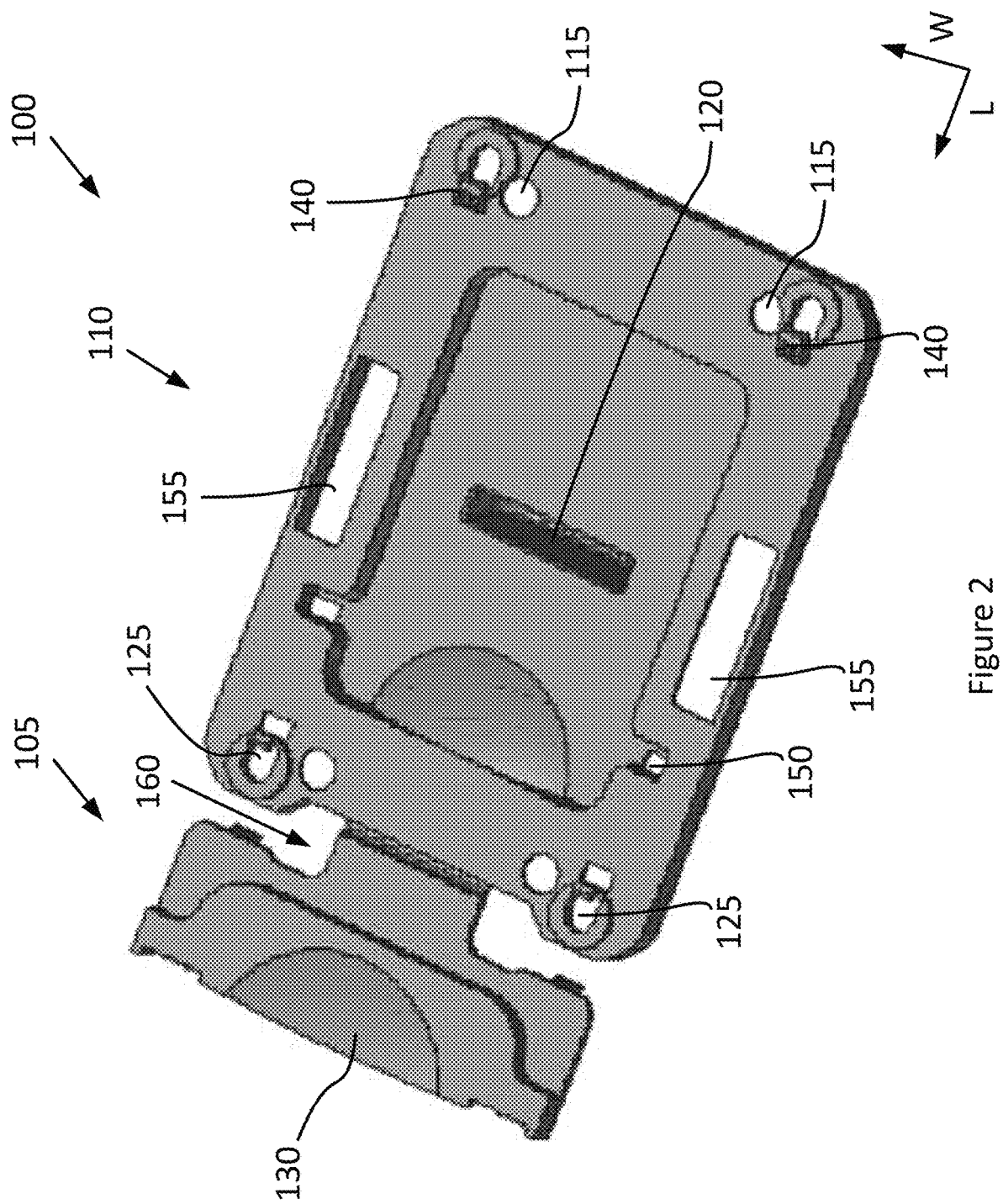
FIG. 2 depicts an alternative view of the example dust cover of FIG. 1, in accordance with various embodiments.

FIGS. 1 and 2 depict an example dust cover 100 in accordance with various embodiments. Specifically, FIGS. 1 and 2 may depict opposite sides of the dust cover 100. As noted above, the dust cover 100 may be a unitary piece of material that may include a locking mechanism 105 and a cover piece 110 that may be joined by a hinge 160. As will be described in further detail below, the hinge 160 may allow the dust cover 100 to be folded about the hinge such that the locking mechanism 105 overlays the cover piece 110. More specifically, the hinge 160 may, in embodiments, be a relatively thing piece of plastic that may be configured to deform such that the locking mechanism 105 can rotate about the hinge 160 to overlay the cover piece 110.

Generally, for the sake of descriptions herein, various elements are enumerated in the Figures and discussed. However, for the sake of clarity, each element in the Figure may not be specifically enumerated. For example, if there are plural of an element such as extra lock 145, only one of the extra lock elements 145 may be specifically enumerated while the other may not be for the sake of clarity of the Figure. It will be understood, though, that the un-enumerated element may share characteristics of the enumerated element. Additionally, the embodiment of the dust cover 100 is intended as just one example configuration of a dust cover 100 that may provide one or more of the advantages described above. Other configurations of a dust cover 100 that may, for example, have different dimensions, a different number of the various elements, etc. may be envisioned by one of skill in the art and may provide one or more of the above-described advantages.

FIGS. 1 and 2 further depict two axes that are perpendicular to one another. The term "width," as used herein, may refer to a distance along the axis marked "W." The term "length," as used herein, may refer to a distance along the axis marked "L." Generally, the term "height" or "z-height" may refer to a distance along an axis that is perpendicular to both the W and the L axes.

Generally, the dust cover 100 may have a length between approximately 100 millimeters (mm) and approximately 150 mm, and more specifically a length of approximately 138 mm, though other embodiments may be longer or shorter. The dust cover 100 may further have a width between approximately 50 mm and approximately 100 mm, and more specifically a width of approximately 78 mm, though other embodiments may be wider or narrower. When laid flat as shown in FIG. 1 or 2, the dust cover 100 may have a height between approximately 10 mm and approximately 30 mm, and more specifically a height of approximately 20 mm, though other embodiments may be taller or shorter. Generally, the locking mechanism 105 may have a length of approximately 30 mm, while the cover piece 110 may have a length of approximately 108 mm, though again other embodiments may be longer or shorter.

The locking mechanism 105 may include a variety of features as depicted in FIGS. 1 and 2. Specifically, the locking mechanism 105 may include a removal grip 130, which may be a molded or slightly hollowed-out portion along the width of the locking mechanism 105. The removal grip 130 may allow a user to position their finger under the locking mechanism 105 when the locking mechanism 105 is in a locked position. The user may then pull on the removal grip 130 to move the locking mechanism 105 from the locked to the unlocked position. As used herein "locked position" may refer to a position wherein the locking mechanism 105 is fully folded over the cover piece 110 to secure the dust cover 100 to a post of a bolster, as described in further detail with respect to FIGS. 3-6, below.

The locking mechanism 105 may also include one or more latch stoppers 135 or one or more extra lock elements 145. The latch stopper(s) 135 and the extra lock element(s) 145 may further secure the dust cover 100 to the post of the bolster, as described in further detail below.

The cover piece 110 may additionally include a variety of features as depicted in FIGS. 1 and 2. Specifically, in some embodiments, the cover piece 110 may include a grip feature 120 that may allow a user of the dust cover 100 to easily hold and or manipulate the dust cover 100 while positioning the dust cover 100 on a socket or manipulating the locking mechanism 105 into a locked or unlocked position. In some embodiments, the grip feature 120 may have a length of approximately 30 mm, a height of approximately 15 mm, and a width of approximately 7 mm, though in other embodiments the grip feature 120 may have other dimensions. In other embodiments, the grip feature 120 may have a different shape than depicted in FIG. 1 or 2, or one or more of the dimensions may be different. In some embodiments, for example as shown in FIG. 2, the grip feature 120 may be hollow while in other embodiments the grip feature 120 may be a solid piece of material.

The cover piece 110 may further include one or more alignment guides 155. In embodiments, the alignment guides 155 may be configured to mate with an element of a socket to which the dust cover 100 is being coupled. In other embodiments, the alignment guides 155 may be cutouts in the dust cover 100 that allow a user to see the socket through the dust cover 100 and allow the user to more easily align the dust cover 100. In other embodiments, the alignment guides 155 may not serve one or more of the above-described purposes and instead may be cutouts that reduce the overall weight/mass of the dust cover 100. In other embodiments, the alignment guides 155 may serve a function in addition to one or more of the above-described functions.

The cover piece 110 may further include a plurality of alignment holes such as alignment holes 115. The alignment holes 115 may be configured to align with one or more posts of a bolster to which a socket is coupled, as will be described in further detail below. As can be seen in FIGS. 1 and 2, the cover piece 110 may include four alignment holes 115 in one embodiment, however other embodiments may have more or fewer alignment holes. The alignment holes 115 may be circular as shown in FIGS. 1 and 2, while in other embodiments the alignment holes may have some other shape such as square, triangular, rectangular, etc. In embodiments, the alignment hole(s) 115 may have a diameter of approximately 6 mm, while in other embodiments the alignment hole(s) may have a larger or smaller diameter dependent, for example, on the size of the post intended to be used with the bolster as described in further detail below. Generally, the number, diameter, or shape of the alignment holes 115 may be dependent on the specific configuration of the socket, and particular the posts of the bolster coupled with the socket, to which the dust cover 100 is to be coupled.

The cover piece 110 may further include a plurality of lock holes 125 and latch mechanisms 140 adjacent to the lock holes 125 as shown in FIGS. 1 and 2. Generally, as will be described in further detail below, the latch mechanisms 140 may be configured to mate with a post of a bolster to which a socket is coupled. When the locking mechanism 105 is in the locked position, the lock holes 125 may allow the latch stopper 135 to pass through the lock holes 125 and engage with the latch mechanism 140 to secure the latch mechanism 140 to the post of the bolster.

Additionally, the cover piece 110 may include extra lock holes 150. The extra lock holes 150 may be configured to couple with the extra lock elements 145 when the locking mechanism 105 is in the locked position. The extra lock elements may have a latch or "hooked" configuration that allows the extra lock elements 145 to removably secure to the extra lock holes 150 to secure the locking mechanism 105 in the locked position.

As noted above, it will be understood that other embodiments of the dust cover 100 may have a different configuration. For example, other embodiments may include a different number, shape, or configuration of various of the above-described elements. Some embodiments may be missing one or more of the above-described elements. For example, some embodiments may not include alignment guides 155, extra lock elements 145, extra lock holes 150, etc.

Figure 3:
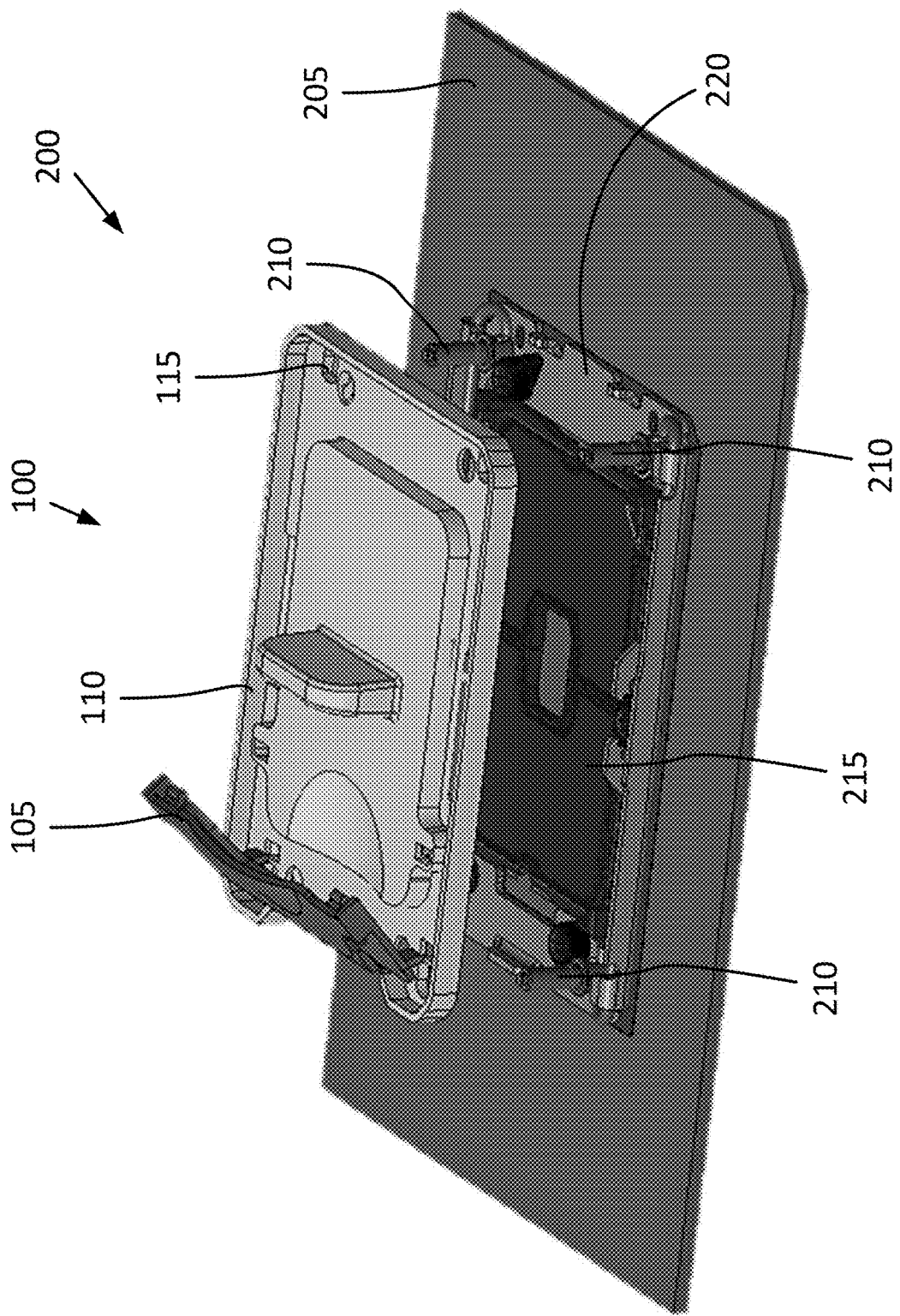
FIG. 3 depicts an example of a system that may include a socket and a dust cover, in accordance with various embodiments.

FIG. 3 depicts an example of a system 200 that may include a socket 215 and the dust cover 100. More generally, FIGS. 3-6 depict a series of depictions of securing a dust cover such as dust cover 100 to protect a socket as described above. Various elements of the dust cover 100 from FIG. 1 or 2 may be shown in any of FIGS. 3-6, but may not be specifically enumerated or described for the sake of clarity and brevity of the Figures and description. Similarly, elements described, for example in FIG. 3, may be depicted in later FIGS. 4-6, but may not be specifically re-enumerated or re-described for the sake of clarity and brevity of the Figures and description.

Specifically, FIG. 3 may depict a stage where the dust cover 100 is being coupled with the socket 215 to protect the socket 215. As can be seen, the locking mechanism 105 may be folded over such that it at least partially overlaps the cover piece 110, however in other embodiments the locking mechanism 105 may be flat (e.g., as depicted in FIGS. 1 and 2) or in some other configuration when it is in the stage of being coupled with the socket 215.

The socket 215 may be, for example, a socket configured to couple with a processor, a CPU, a memory, or some other computing component. The socket 215 may in turn be coupled with a bolster 220, which may be coupled with a substrate 205. The substrate 205 may be, for example, a cored or a coreless substrate that may include a dielectric material such as ajimoto build-up film (ABF) or some other dielectric material. In embodiments, the substrate 205 may include a plurality of sockets such as socket 215, and one or more of the sockets may be coupled with a dust cover such as dust cover 100. For example, the substrate 205 may be used to ship one or more of the sockets from one place to another so that they may later be removed from the substrate and installed in one or more computing devices. In other embodiments, the substrate 205 may itself be an element of a computing device. For example, the substrate 205 may be a printed circuit board (PCB) with a variety of elements such as traces, vias, pads, etc. In this embodiment, the socket 215 may be communicatively coupled with one or more of the traces/pads/vias. However, the socket 215 may be empty as shown in FIG. 3. It may therefore be desirable to protect the socket 215 so it is still viable for later use, and so a dust cover such as dust cover 100 may be used to do so.

The bolster 220 may be used to provide increased structural support for the socket 215. For example, the bolster 220 may be made of a relatively stiff material such as sheet metal, hardened plastic, or some other material. Because the bolster 220 may be made of a relatively stiff material, the bolster 220 may prevent the socket 215 from structural deformation such as warping or twisting if the socket 215 or substrate 205 are subjected to external forces. Such forces could come from, for example, coupling a component to the socket 215, removing a component from the socket 215, shipping the substrate 205, forces experienced by a computing device of which the substrate 205 is a part (e.g., dropping or moving the computing device), etc.

The bolster 220 may include one or more posts such as posts 210. The posts 210 may be as described above and may be configured to couple with the alignment holes 115 of the dust cover 100. In embodiments, the posts 210 may have a z-height of approximately 22 mm, while in other embodiments the posts may have a greater or lesser z-height. As can be seen in FIG. 3, the posts 210 may have a generally circular cross-section with a diameter of approximately 4.2 mm, though again in other embodiments the posts 210 may have a greater or lesser diameter. In other embodiments the posts 210 may have a square cross-section, a rectangular cross-section, a triangular cross-section, or some other shape of a cross-section.

Figure 4:
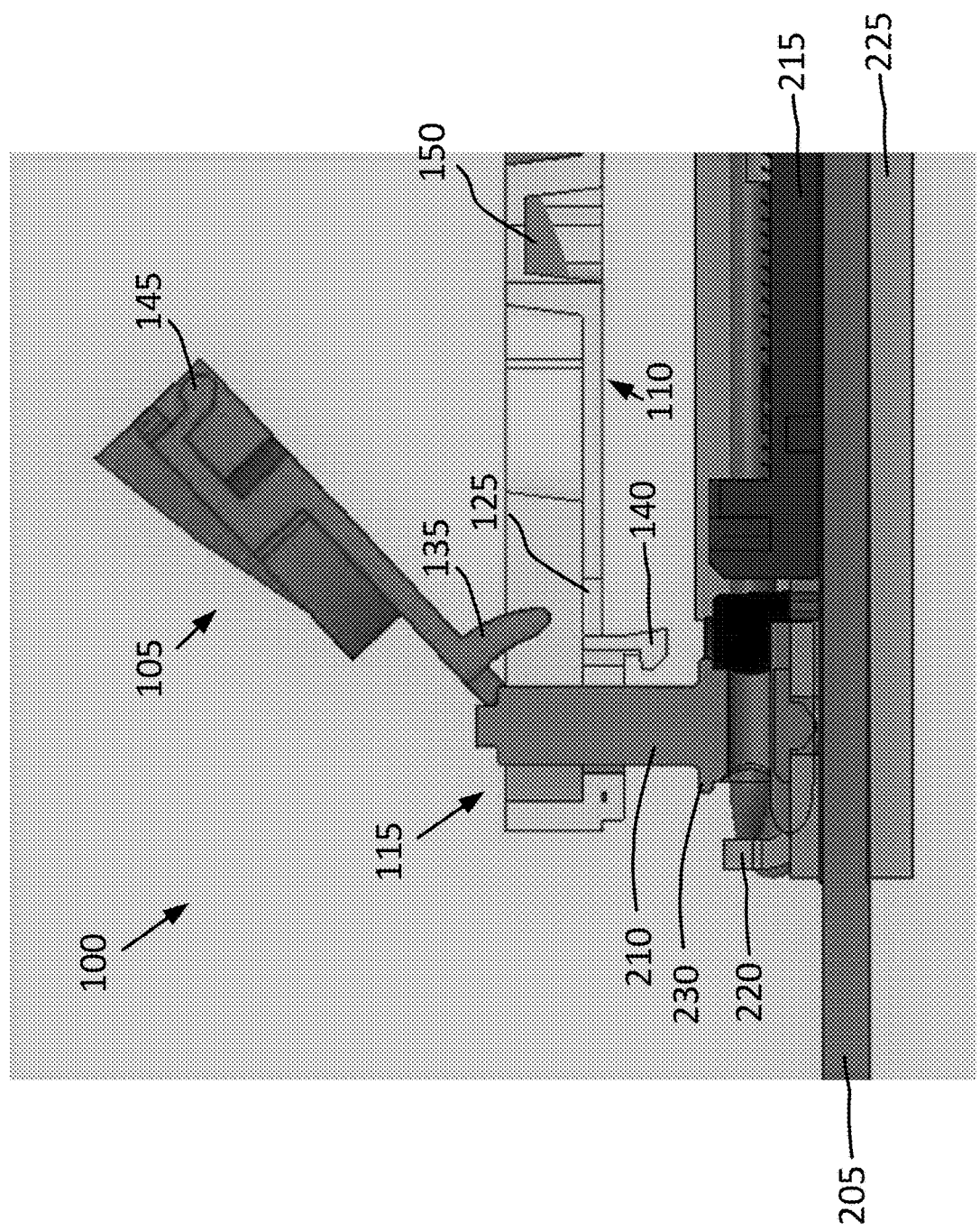
FIG. 4 depicts a further example of the system of FIG. 3, in accordance with various embodiments.

FIG. 4 depicts a more detailed cross-section of the dust cover 100 coupling with the bolster 220 to protect the socket 215. As described earlier, the dust cover 100 may include a cover piece 110 and a locking mechanism 105. The locking mechanism 105 may include a latch stopper 135 and an extra lock element 145. The cover piece 110 may include the latch mechanism 140, the lock hole 125, and the extra lock hole 150.

As can further be seen in FIG. 4, a substrate 205 may include a socket 215 and a bolster 220 coupled thereto. The bolster 220 may include a plurality of posts such as post 210 that may be configured to go through alignment hole 115 of the dust cover 100. The post 210 may include a post bump 230 at a portion of the post 210 relatively close to the socket 215. In some embodiments, the post bump 230 may be a unitary ring that surrounds the circumference of the post 210, while in other embodiments the post bump 230 may be a plurality of separate elements that may be, for example, spaced apart from one another. In some embodiments, the post 210 may include a plurality of post bumps 230 spaced at intervals along the length of the post 210.

As can be seen in more detail in FIG. 4, when the locking mechanism 105 is moved towards the locked position such that it covers the cover piece 110, the latch stopper 135 may line up with the lock hole 125. Similarly, the extra lock element 145 may align with the extra lock hole 150.

As can further be seen in FIG. 4, the bolster 220 may include a bolster back side 225 on an opposite side of the substrate 205 from the bolster 220. The bolster back side 225 may be configured to removably couple with the bolster 220, for example by a screw, a snap, rivets, or some other fastener. The bolster back side 225 may help secure the bolster 220 to the substrate 205, and may further provide structural support to the bolster 220 to prevent the bolster 220 from bending/warpage/etc. due to physical force as described above.

Figure 5:
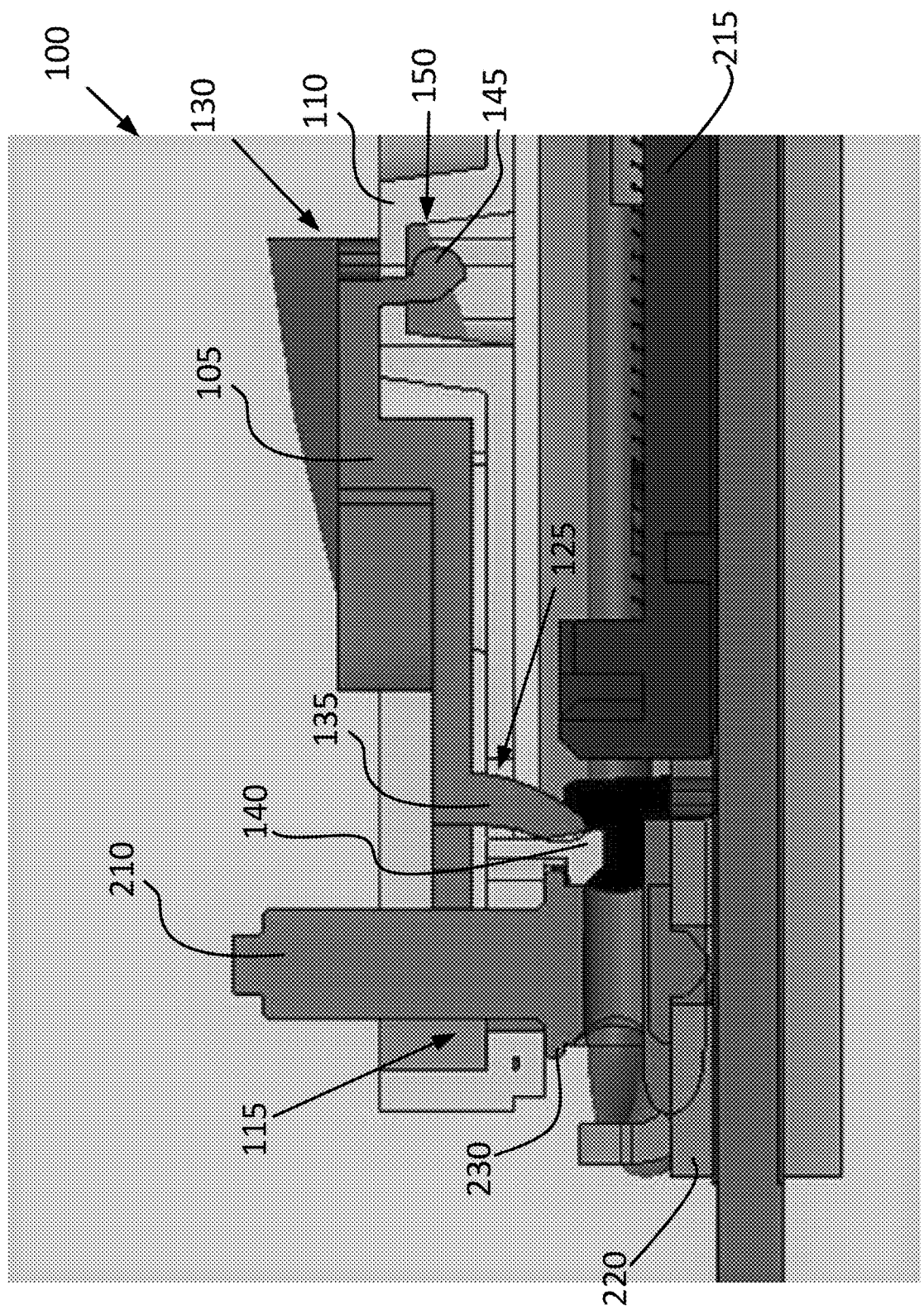
FIG. 5 depicts a further example of the system of FIG. 3, in accordance with various embodiments.

FIG. 5 depicts another detailed cross-section of the dust cover 100 coupled with the bolster 220 with the locking mechanism 105 in a fully locked position, that is, fully secured to and overlaying the cover piece 110.

As can be seen, the extra lock element 145 may be fully inserted into the extra lock hole 150. The extra lock element 145 may be slightly flanged as shown such that it removably secures against the cover piece 110 at a side of the cover piece 110 and the extra lock hole 150 that faces the socket 215. Because the dust cover 100 may be a material such as injection molded plastic, it may have some slight flexibility so that the extra lock element 145 may be able to flex and either enter into the extra lock hole, or be removed from the extra lock hole 150. In this manner, the dust cover 100 may be held in the "locked" position. Generally, it may require between approximately 0.2 foot-pounds and approximately 1 foot-pound of force, and more specifically approximately 0.5 foot-pounds of force to be exerted on the locking mechanism 105, and particularly the removal grip 130 of the locking mechanism 105, to secure the dust cover 100 in the locked position. Additionally, it may require between approximately 0.2 foot-pounds and approximately 1 foot-pound of force, and more specifically approximately 0.5 foot-pounds of force to be exerted to be exerted on the removal grip 130 to move the dust cover 100 from the locked position to the unlocked position.

As can further be seen, the dust cover 100 may be positioned on the socket 215, and more specifically on the bolster 220, such that the post 210 extends through the alignment hole 115. The latch mechanism 140 may reach to the side of the post bump 230 that is opposite the dust cover 100. Specifically, a user may exert a push force of less than or equal to 4.3 foot-pounds of force, and in some embodiments, less than or equal to one foot-pound of force, on the dust cover 100 to push the dust cover 100 along the post 210. The latch mechanism 140 may be made of a material such as the dust cover material described above, and so may be slightly deformable. As the dust cover 100 is pushed along the post 210, the latch mechanism 140 may slightly deform when it encounters the post bump 230 and hook over the post bump 230. Because the latch mechanism 140 is "flanged" or "hooked" as shown, it may removably secure to the post bump 230 as shown. Further, the latch stopper 135 may be inserted through the lock hole 125 as shown and may physically contact and exert a physical force against the latch mechanism 140. Specifically, the latch stopper 135 may exert a force of between approximately 3 foot-pounds and approximately 5 foot-pounds against the latch mechanism 140.

This configuration of the latch mechanism 140 and the latch stopper 135 may provide a variety of features. Specifically, the latch mechanism 140 may be secured against the post 210, and below the post bump 230, when the dust cover 100 is in the locked position and the latch stopper 135 is positioned against the latch mechanism 140. It may be difficult to remove the dust cover 100 and expose the socket 215 without a significant amount of force when the dust cover 100 is so secured to the bolster 220 because the latch mechanism 140 may catch on the post bump 230 of the post 210 and prevent the dust cover 100 from being removed along the post 210. However, when the dust cover 100 is in an unlocked position such that the latch stopper 135 is not pressed against the latch mechanism 140, the latch mechanism 140 may be slightly deformable. As such, the latch mechanism 140 may deform around the post bump 230 and the dust cover 100 may be removed from the socket 215 with a pull force of less than or equal to 3.7 foot-pounds of force and, in some embodiments, less than or equal to one foot-pound of force.

Figure 6:
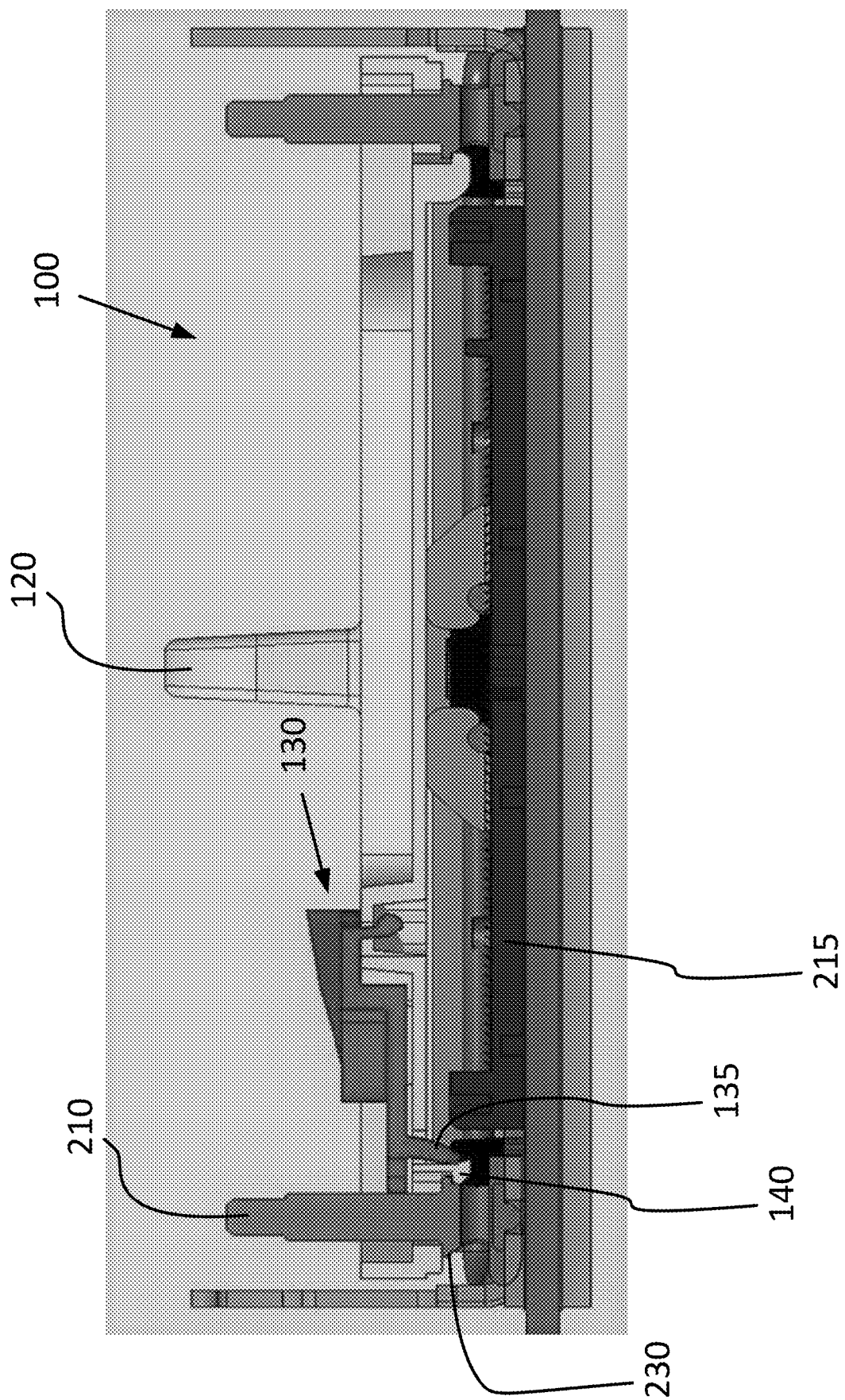
FIG. 6 depicts a further example of the system of FIG. 3, in accordance with various embodiments.

FIG. 6 depicts a more complete cross-section of a dust cover 100 coupled with a socket 215 to explain how the dust cover 100 may be removed. As noted, a force of approximately 0.5 foot-pounds may be exerted on the removal grip 130 to move the dust cover 100 from the locked to an unlocked position. When the dust cover 100 is moved to the unlocked position, the force exerted by the latch stopper 135 against the latch mechanism 140 may be removed. A user may then grasp the grip feature 120, for example using their fingers or a tool such as pliers or some other tool, and exert a pull force of less than or equal to 3.7 foot-pounds of force and, in some embodiments, less than or equal to one foot-pound of force. Exerting this pull force may cause the latch mechanism 140 to deform around the post bump 230 and so allow a user to move the dust cover 100 along the post 210 and remove the dust cover 100, thereby exposing the socket 215.

It will again be noted that the embodiments depicted herein, and particularly the specific configurations thereof, are intended as examples and other embodiments may have one or more additional or alternative elements, or may be missing one or more elements. For example, in some embodiments, the dust cover may be configured to protect a plurality of sockets rather than just a single socket. In some embodiments, the locking mechanism may be a plurality of separated locking mechanisms rather than a single piece that spans the width of the cover piece. In some embodiments, the dust cover may have a plurality of locking mechanisms at either end along the length or the width of the dust cover. Other variations may be envisioned by one of skill in the art.

Figure 7:
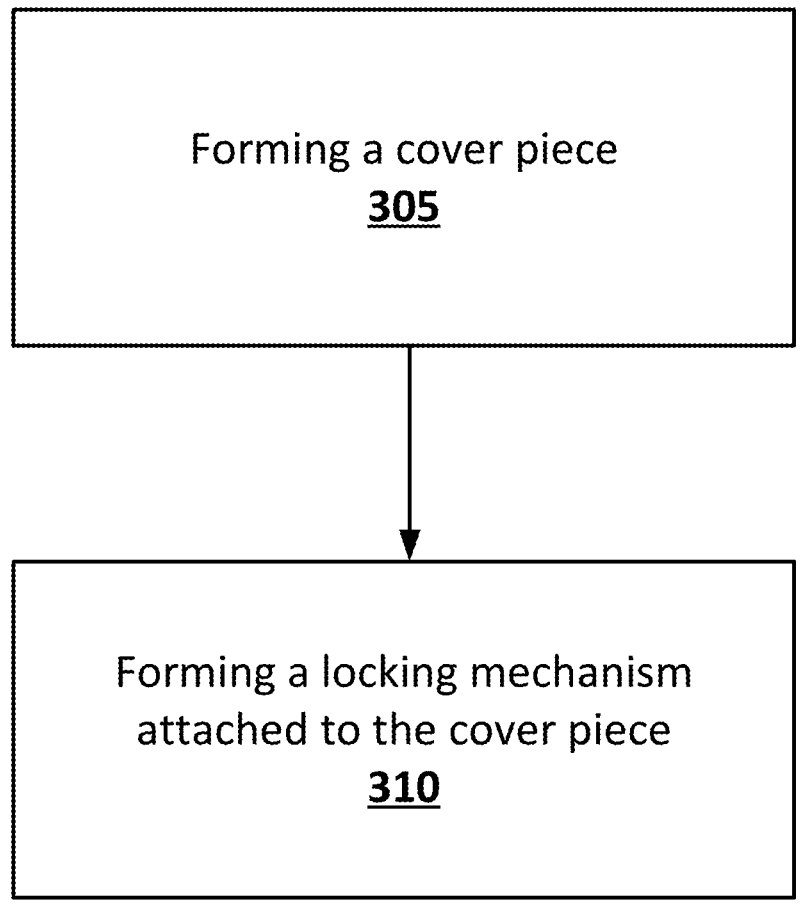
FIG. 7 depicts an example technique for making a dust cover, in accordance with various embodiments.

FIG. 7 depicts an example technique that may be used to generate a dust cover such as dust cover 100. Specifically, the technique may include forming, at 305, a cover piece and forming, at 310, a locking mechanism attached to the cover piece. In embodiments, the cover piece may be, for example, cover piece 110. The locking mechanism may be, for example, locking mechanism 105. More specifically, in embodiments, the locking mechanism may be configured to removably secure the dust cover to a bolster coupled with a socket such that the cover piece overlays the socket and a first side of the cover piece is facing the socket.

As noted above, the dust cover 100 may be formed of a single unitary piece of material, and so elements 305 and 310 may be performed simultaneously. More specifically, in some embodiments, elements 305 and 310 may be performed simultaneously because the dust cover may be a single piece of injection molded material. Therefore, in some embodiments elements 305 and 310 may, in embodiments, be performed simultaneously to generate a locking mechanism such as locking mechanism 105, a cover piece such as cover piece 110, and a hinge such as hinge 160. In other embodiments, the elements may be performed sequentially (i.e., element 305 may be performed prior to element 310, or vice-versa). In this embodiment, the hinge (e.g., hinge 160) may be formed simultaneously with element 305, element 310, or separately from either of elements 305 or 310.

EXAMPLES OF EMBODIMENTS HEREIN

Example 1 includes a dust cover comprising: a cover piece; and a locking mechanism attached to the cover piece by a hinge, wherein the locking mechanism, when in a locked position, is to removably secure the dust cover to a bolster such that the cover piece overlays a socket coupled with the bolster and a first side of the cover piece is facing the socket.

Example 2 includes the dust cover of example 1, wherein the cover piece, the hinge, and the locking mechanism are a unitary piece of material.

Example 3 includes the dust cover of example 1, wherein the cover piece includes a hole to align with a post of the bolster such that the post is positioned within the hole when the cover piece overlays the socket.

Example 4 includes the dust cover of example 3, wherein the cover piece includes a dust cover latch on the first side of the cover piece, wherein the dust cover latch is to couple with a bump on the bolster to removably secure the dust cover to the bolster when the locking mechanism is in a locked position.

Example 5 includes the dust cover of example 4, wherein the locking mechanism further includes a latch stopper that, when the locking mechanism is in a locked position, engages through a hole in the cover piece to physically engage with the dust cover latch.

Example 6 includes the dust cover of any of examples 1-5, wherein the cover piece includes a grip feature on a second side of the cover piece that is opposite the first side of the cover piece.

Example 7 includes the dust cover of any of examples 1-5, wherein the dust cover is couplable to the bolster using less than one foot-pound of force.

Example 8 includes the dust cover of any of examples 1-5, wherein the dust cover is removable from the bolster using less than one foot-pound of force.

Example 9 includes a substrate comprising: a bolster; a socket coupled with the bolster; and a dust cover that is a unitary piece of material that includes a cover piece and a locking mechanism joined by a hinge of the same material as the cover piece and the locking mechanism, the dust cover removably coupled with the bolster such that when the locking mechanism is in a locked position the cover piece overlays the socket.

Example 10 includes the substrate of example 9, wherein the socket is a first socket and the cover piece is a first cover piece.

Example 11 includes the substrate of example 9, wherein the dust cover is couplable to the bolster using less than 4.3 foot-pounds of force.

Example 12 includes the substrate of example 9, wherein the dust cover is removable from the bolster using less than 3.7 foot-pounds of force.

Example 13 includes the substrate of any of examples 9-12, wherein the locking mechanism is a first locking mechanism and wherein the dust cover further includes a second locking mechanism opposite the first locking mechanism.

Example 14 includes the substrate of example 13, wherein the first locking mechanism is to couple with a first post of the bolster when the first locking mechanism is in the locked position, and the second locking mechanism is to couple with a second post of the bolster when the second locking mechanism is in the locked position.

Example 15 includes a method of forming a dust cover for a socket of a computing device, the method comprising: forming a cover piece; and forming a locking mechanism attached to the cover piece, wherein the locking mechanism, when in a locked position, is to removably secure the dust cover to a bolster coupled with a socket such that the cover piece overlays the socket and a first side of the cover piece is facing the socket.

Example 16 includes the method of example 15, wherein forming the cover piece and the locking mechanism includes forming the cover piece and the locking mechanism as a unitary piece of material.

Example 17 includes the method of example 15, wherein forming the cover piece and forming the locking mechanism includes injection molding the cover piece and the locking mechanism.

Example 18 includes the method of any of examples 15-17, wherein the dust cover is couplable to the bolster using less than one foot-pound of force.

Example 19 includes the method of any of examples 15-17, wherein the dust cover is removable from the bolster using less than one foot-pound of force.

Example 20 includes a dust cover made up of a unitary piece of injection molded material, the dust cover comprising: a cover piece with a first side and a second side opposite the first side, wherein the first side includes a grip feature and the second side includes a dust cover latch; and a locking mechanism attached to the cover piece, wherein the locking mechanism includes a first side adjacent to the first side of the cover piece and a second side adjacent to the second side of the cover piece; wherein when the locking mechanism is in a locked position, the first side of the locking mechanism is facing the first side of the cover piece.

Example 21 includes the dust cover of example 20, wherein the dust cover latch is to couple with a bump on a bolster to which a socket is coupled.

Example 22 includes the dust cover of example 21, wherein the first side of the locking mechanism further includes a latch stopper that, when the locking mechanism is in a locked position, engages through a hole in the cover piece to physically engage with the dust cover latch.

Example 23 includes the dust cover of example 21, wherein when the locking mechanism is in an unlocked position, the dust cover is removable from the bolster by application of a force of less than 1 foot-pound in a direction away from the socket.

Example 24 includes the dust cover of any of examples 20-23, wherein the locking mechanism is to move from an unlocked position to the locked position under less than 1 foot-pound of force.

Example 25 includes the dust cover of any of examples 20-23, wherein the locking mechanism is to move from the locked position to an unlocked position under less than 1 foot-pound of force.

Various embodiments may include any suitable combination of the above-described embodiments including alternative (or) embodiments of embodiments that are described in conjunctive form (and) above (e.g., the "and" may be "and/or"). Furthermore, some embodiments may include one or more articles of manufacture (e.g., non-transitory computer-readable media) having instructions, stored thereon, that when executed result in actions of any of the above-described embodiments. Moreover, some embodiments may include apparatuses or systems having any suitable means for carrying out the various operations of the above-described embodiments.

The above description of illustrated implementations of the present disclosure, including what is described in the Abstract, is not intended to be exhaustive or to limit the present disclosure to the precise forms described. While specific implementations of, and examples for, the present disclosure are described herein for illustrative purposes, various equivalent modifications are possible within the scope of the present disclosure, as those skilled in the relevant art will recognize.

The invention claimed is:

1. A dust cover assembly, comprising:
a cover piece including a hole and a dust cover latch on a first side of the cover piece; and
a locking mechanism attached to the cover piece by a hinge, wherein the locking mechanism,
when in a locked position, is to removably secure the dust cover to a bolster such that the cover piece
overlays a socket coupled with the bolster and the first side of the cover piece is facing the socket,
wherein the hole in the cover piece aligns with a post of the bolster such that the post is positioned within the hole when the cover piece overlays the socket, and wherein the dust cover latch couples with a bump on the bolster to removably secure the dust cover to the bolster when the locking mechanism is in a locked position.

2. The dust cover assembly of claim 1, wherein the cover piece, the hinge, and the locking mechanism are a unitary piece of material.

3. The dust cover assembly of claim 1, wherein the locking mechanism further includes a latch stopper that, when the locking mechanism is in a locked position, engages through a hole in the cover piece to physically engage with the dust cover latch.

4. The dust cover assembly of claim 1, wherein the cover piece includes a grip feature on a second side of the cover piece that is opposite the first side of the cover piece.

5. The dust cover assembly of claim 1, wherein the dust cover is couplable to the bolster using less than one foot-pound of force.

6. The dust cover assembly of claim 1, wherein the dust cover is removable from the bolster using less than one foot-pound of force.

7. A substrate having a dust cover assembly, comprising:
a bolster including a first post and a second post;
a socket coupled with the bolster; and
a dust cover that is a unitary piece of material including a cover piece, a first locking mechanism, and a second locking mechanism opposite the first locking mechanism, wherein the cover piece and the first locking mechanism are joined by a hinge of the same material as the cover piece and the first locking mechanism, wherein the first locking mechanism couples with the first post of the bolster when the first locking mechanism is in the locked position and the second locking mechanism couples with the second post of the bolster when the second locking mechanism is in the locked position, and wherein the dust cover is removably coupled with the bolster such that when the first and second locking mechanisms are in a locked position the cover piece overlays the socket.

8. The substrate having a dust cover assembly of claim 7, wherein the socket is a first socket and the cover piece is a first cover piece.

9. The substrate having a dust cover assembly of claim 7, wherein the dust cover is couplable to the bolster using less than 4.3 foot-pounds of force.

10. The substrate having a dust cover assembly of claim 7, wherein the dust cover is removable from the bolster using less than 3.7 foot-pounds of force.

11. A method of forming a dust cover assembly for a socket of a computing device, the method comprising:
forming a cover piece including a hole and a dust cover latch on a first side of the cover piece; and
forming a locking mechanism attached to the cover piece by a hinge, wherein the locking mechanism, when in a locked position, is to removably secure the dust cover to a bolster coupled with a socket such that the cover piece overlays the socket and a first side of the cover piece is facing the socket, wherein the hole in the cover piece aligns with a post of the bolster such that the post is positioned within the hole when the cover piece overlays the socket, and wherein the dust cover latch couples with a bump on the bolster to removably secure the dust cover to the bolster when the locking mechanism is in a locked position.

12. The method of claim 11, wherein forming the cover piece and the locking mechanism includes forming the cover piece and the locking mechanism as a unitary piece of material.

13. The method of claim 11, wherein forming the cover piece and forming the locking mechanism includes injection molding the cover piece and the locking mechanism.

14. The method of claim 11, wherein the dust cover is couplable to the bolster using less than one foot-pound of force.

15. The method of claim 11, wherein the dust cover is removable from the bolster using less than one foot-pound of force.

16. A dust cover assembly made up of a unitary piece of injection molded material, the dust cover assembly comprising:
- a cover piece with a first side and a second side opposite the first side, wherein the first side includes a grip feature and the second side includes a dust cover latch, wherein the dust cover latch is to couple with a bump on a bolster to which a socket is coupled; and
- a locking mechanism attached to the cover piece, wherein the locking mechanism includes a first side adjacent to the first side of the cover piece and a second side adjacent to the second side of the cover piece, wherein the first side of the locking mechanism includes a latch stopper, and wherein when the locking mechanism is in a locked position, the first side of the locking mechanism is facing the first side of the cover piece and the latch stopper engages through a hole in the cover piece to physically engage with the dust cover latch.

17. The dust cover assembly of claim 16, wherein when the locking mechanism is in an unlocked position, the dust cover is removable from the bolster by application of a force of less than one foot-pound in a direction away from the socket.

18. The dust cover assembly of claim 16, wherein the locking mechanism is to move from an unlocked position to the locked position under less than 1 foot-pound of force.

19. The dust cover assembly of claim 16, wherein the locking mechanism is to move from the locked position to an unlocked position under less than 1 foot-pound of force.

* * * * *